United States Patent [19]
Buck

[11] Patent Number: 6,130,549
[45] Date of Patent: Oct. 10, 2000

[54] OUTPUT DRIVER OF AN INTEGRATED SEMICONDUCTOR CHIP

[75] Inventor: Martin Buck, München, Germany

[73] Assignee: Siemens Aktiengesellschaft, Munich, Germany

[21] Appl. No.: 09/346,379

[22] Filed: Jul. 1, 1999

[30] Foreign Application Priority Data

Jul. 1, 1998 [DE] Germany ............................ 198 29 487

[51] Int. Cl.[7] .................................................. H03K 19/092
[52] U.S. Cl. .............................. 326/26; 326/27; 327/108; 327/437
[58] Field of Search .................................. 326/26, 27, 83; 327/108, 427

[56] References Cited

U.S. PATENT DOCUMENTS 4,894,561  1/1990  Nogami ...................................... 326/27
5,206,544  4/1993  Chen et al. ................................. 326/30
5,367,210  11/1994 Lipp ........................................... 326/26
5,546,029  8/1996  Koke ......................................... 327/108
5,594,373  1/1997  McClure .................................... 327/108

Primary Examiner—Tan T. Nguyen
Attorney, Agent, or Firm—Herbert L. Lerner; Laurence A. Greenberg; Werner H. Stemer

[57] ABSTRACT

An output driver for an integrated semiconductor chip overcomes voltage fluctuations at connections of a supply voltage of the semiconductor chip generated by a rapid-switching output driver. The output driver includes a switching circuit which is connected to the supply voltage and contains two switching transistors, as well as a regulating circuit for voltage-dependent regulation of switching characteristics of the switching circuit. As a result of the regulating circuit, the switching characteristics of at least one transistor of the switching circuit are regulated in such a way as to counteract voltage fluctuations arising at the connections to the supply voltage through the switching process of the switching circuit.

4 Claims, 3 Drawing Sheets

1 - without regulation
2 - with regulation

OUTPUT DRIVER OF AN INTEGRATED SEMICONDUCTOR CHIP

BACKGROUND OF THE INVENTION

Field of the Invention

The invention relates to an output driver of an integrated semiconductor chip, including a transistor switching circuit connected to a supply voltage, and a regulating circuit for voltage-dependent regulation of switching characteristics of the switching circuit.

Integrated semiconductor chips can contain several functional groups, such as arrays of memory cells, decoders, multiplexers or output drivers. An output driver outputs an output signal to an output signal line in response to an input signal. Necessary digital switching functions can be realized, for example, by using MOS inverter circuits of the known type. An example of a basic logic gate of that kind is the CMOS inverter. Almost ideal levels are obtained, losses are kept low and the switching speed is relatively high in comparison with other inverter circuits (e.g. NMOS inverters), by using a switching circuit of that type. One disadvantage of that simple basic circuit is that rapid switching causes voltage fluctuations at connections to the supply voltage of the output driver, which can impair its function. Voltage fluctuations of the supply voltage can also be generated in the remaining part of the chip. Since other functional groups in the chip are also connected to the supply voltage, the function of the chip may be endangered, depending on how sensitive the respective circuits are towards irregularities in the supply voltage.

In U.S. Pat. No. 4,894,561 a driver circuit is described in which the dependence of the output voltage on fluctuations of the temperature and the supply voltage is reduced. That prevents the possibility of an increase in temperature or in the potential at the supply voltage leading to significant increases in the switching speeds of the transistors of the driver circuit, and consequently in the mutual conductances of the output signal. As a result, signal noise is suppressed at the output and at the supply voltage of the driver circuit.

U.S. Pat. No. 5,206,544 discloses a circuit of an output driver for suppression of noise at the output signal and the supply voltage. The mutual conductance of the output signal is held constant through a switching process over regulating circuits. A reduced signal noise is achieved as a result.

Higher and higher data rates for digital chips require rapidly switching output drivers. The requirements with respect to switching characteristics and switching edges which such drivers have to meet are highly dependent on the applied load. Heretofore attempts were made to optimize output drivers for a defined load and to allow them to switch slowly enough that the voltage fluctuations they caused were just acceptable. In order to do that it is necessary to know important parameters, such as inductances or capacitances of the load. The disadvantage of that procedure is that those measures restrict the output driver to a defined application. Frequently, however, the areas of use and their ambient conditions, such as the output capacitance of the output signal line, are not known. The manufacture of semiconductor circuits is also associated with uncertainties falling within the range of production tolerances, so that optimal adjustment of the output driver to the defined load is difficult even when the values of the load parameters are known.

SUMMARY OF THE INVENTION

It is accordingly an object of the invention to provide an output driver of an integrated semiconductor chip, which overcomes the hereinafore-mentioned disadvantages of the heretofore-known devices of this general type and which keeps voltage fluctuations at connections to a supply voltage that are caused by switching processes of the output driver sufficiently small to enable functioning of the chip to be maintained.

With the foregoing and other objects in view there is provided, in accordance with the invention, an output driver of an integrated semiconductor chip, the output driver generating an output signal output over an output signal line from an input signal supplied over an input signal line, and the output driver comprising a switching circuit including two transistors having gate terminals, having main current paths connected in series and connected to a supply voltage with a first supply potential and a second supply potential; and a regulating circuit for voltage-dependent regulation of switching characteristics of the switching circuit, the regulating circuit including a first transistor having a gate terminal connected to the input signal; second and third transistors together forming a current mirror, the second transistor having a main current path forming an input path of the current mirror, the third transistor having a gate terminal and having a main current path forming an output path of the current mirror, and the input and output paths of the current mirror each having first and second connections; the first connection of the input path of the current mirror connected to a third supply potential of the supply voltage and the first connection of the output path of the current mirror connected to the second supply potential of the supply voltage; the first transistor having a main current path with a first connection connected to a fourth supply potential of the supply voltage and with a second connection connected to the input path of the current mirror; a first resistor connected between the gate terminal of the third transistor and the third supply potential of the supply voltage; a second resistor connected between the second connection of the output path of the current mirror and the fourth supply potential of the supply voltage; a fourth transistor having a gate terminal connected to the second connection of the output path of the current mirror and having a main current path with first and second connections; the first connection of the main current path of the fourth transistor connected to the fourth supply potential of the supply voltage; a third resistor connected between the second connection of the main current path of the fourth transistor and the second supply potential of the supply voltage; and a connection carrying an output signal of the regulating circuit and connected between the second connection of the main current path of the fourth transistor and the gate terminal of one of the transistors of the switching circuit.

In accordance with another feature of the invention, the two transistors of the switching circuit are first and second transistors having different conduction types and having a coupling node therebetween; the output signal line for the output signal is connected to the coupling node; and the first transistor of the switching circuit is connected to the first supply potential of the supply voltage and the second transistor of the switching circuit is connected to the second supply potential of the supply voltage.

In accordance with a further feature of the invention, the transistors are field effect transistors; the first transistor of the regulating circuit is of the p-channel type, the second transistor of the regulating circuit is of the n-channel type, the third transistor of the regulating circuit is of the n-channel type, and the fourth transistor of the regulating circuit is of the p-channel type; the first transistor of the switching circuit is of the p-channel type and the second transistor of the switching circuit is of the n-channel type; the first supply potential and the fourth supply potential of the supply voltage are higher than the second supply potential and the third supply potential of the supply voltage; and the third supply potential and the second supply potential of the supply voltage are decoupled on the semiconductor chip.

In accordance with a concomitant feature of the invention, the transistors are field effect transistors; the first transistor of the regulating circuit is of the n-channel type, the second transistor of the regulating circuit is of the p-channel type, the third transistor of the regulating circuit is of the p-channel type, and the fourth transistor of the regulating circuit is of the n-channel type; the first transistor of the switching circuit is of the n-channel type and the second transistor of the switching circuit is of the p-channel type; the second supply potential and the third supply potential of the supply voltage are higher than the first supply potential and the fourth supply potential of the supply voltage; and the first supply potential and the fourth supply potential of the supply voltage are decoupled on the semiconductor chip.

Other features which are considered as characteristic for the invention are set forth in the appended claims.

Although the invention is illustrated and described herein as embodied in an output driver of an integrated semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
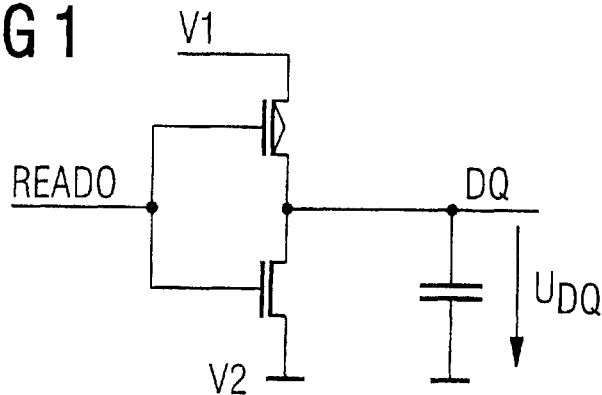
FIG. 1 is a schematic diagram of a switching circuit in accordance with an inverter of the CMOS type.

Referring now to the figures of the drawings in detail and first, particularly, to FIG. 1 thereof, there is seen a switching circuit of an output driver in accordance with an inverter of the CMOS type. An input signal READ0 is applied to gates of two switching transistors of the switching circuit. A first supply potential of a supply voltage is designated by reference symbol V1 and a second supply potential of the supply voltage is designated by reference symbol V2. Each of the two potentials is connected to a single connection of the switching circuit. An output signal line with an output signal DQ is connected to a line capacitor. The second connection V2 of the supply voltage of the switching circuit of the output driver (corresponding in this case to a driver reference voltage) is usually led out of the chip in order to better decouple the supply voltage of the switching circuit from a supply voltage of the rest of the chip. The led-out supply voltage line contains line inductances (that are not shown in FIG. 1), which form a system capable of oscillating, together with the line capacitor of the output signal line.

A principal sequence of the switching process of the switching circuit will now be explained in more detail on the basis of FIG. 2. In this case a state "log.1" corresponds to a higher potential of the supply voltage (for example a supply potential VCCQ=5V) and a state "log.0" corresponds to a lower potential of the supply voltage (for example VSSQ= 0V). A starting situation is formed by the signals READ0 and DQ with states READ0=log.0 and DQ=log.1. The signal READ0=log.1 is applied to the input signal line (meaning "output the output signal DQ=log.0"). This signal change causes the voltage at DQ ($U_{DQ}$) to drop. As a result of an inductive voltage drop, the driver reference voltage V2 increases from its stationary value V20 (Curve 1). The shape of the curve, which illustrates characteristics similar to those of an oscillating circuit, is primarily determined by the line inductance of the led-out supply voltage line, by the line capacitance of the output signal line, and by the line and bulk resistance of the transistor. If the driver reference voltage is not sufficiently decoupled from the remaining supply voltage of the semiconductor chip, the function of the entire chip can be impaired.

Figure 3:
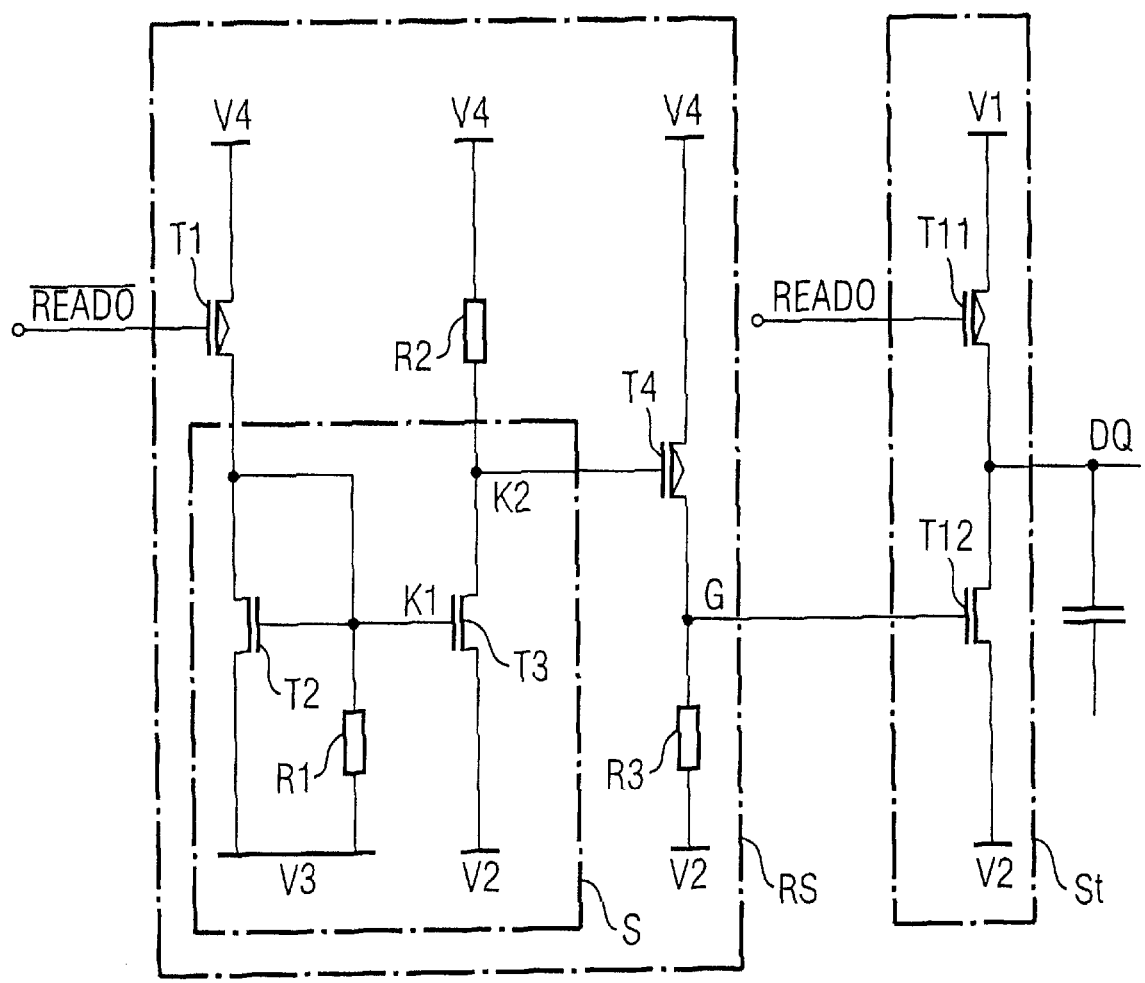
FIG. 3 is a schematic circuit diagram of an output driver with voltage-dependent regulated switching characteristics for a switching process DQ=log.1 to DQ=log.0 with an example of a voltage progression according to FIG. 2.

FIG. 3 shows an output driver with voltage-dependent regulated switching characteristics. A supply voltage of the output driver has four supply potentials. The second supply potential V2 of the supply voltage of the output driver is led out and is decoupled from a third supply potential V3 on the semiconductor chip. The two potentials are equal in a stationary state. The supply potential V2 corresponds, for example, to the driver reference voltage VSSQ and the supply potential V3 corresponds, for example, to the chip reference voltage VSS. The first supply potential V1 and a fourth supply potential V4 of the supply voltage correspond to a higher potential in comparison with the supply potentials V2 and V3 whereby, for example, it can be that V1=VCCQ and V4=V1.

The output driver as shown in FIG. 3 is formed of a switching circuit St and in addition a regulating circuit RS for voltage-dependent regulation of the switching characteristics of the switching circuit St.

The output driver includes an input signal line with an input signal READ0 and an output signal line with an output signal DQ. The switching circuit is formed of first and second transistors T11 and T12, which have main current paths connected in series and which are connected to a supply voltage. The first transistor T11 and the second transistor T12 of the circuit St are of different channel types. The output signal line with the output signal DQ is connected to a coupling node between the two transistors T11 and T12 of the switching circuit St. The switching circuit St is connected with the first transistor T11 at the first supply potential V1 of the supply voltage and with the second transistor T12 at the second supply potential V2 of the supply voltage.

The structure of the regulating circuit RS is described in the following: The input signal READ0 is connected to a gate of a first transistor T1, which is of the p-channel type. A second transistor T2 of the n-channel type and a third transistor T3 of the n-channel type together form a current mirror S. A main current path of the transistor T2 forms an input path of the current mirror S and a main current path of the transistor T3 forms an output path of the current mirror S. A first connection of the input path of the current mirror S is connected to the third supply potential V3 of the supply voltage and a first connection of the output path of the current mirror S is connected to the second supply potential V2 of the supply voltage. A first connection of the main current path of the first transistor T1 is connected to the fourth supply potential V4 of the supply voltage and a second connection of the main current path of the first transistor T1 is connected to a second connection of the input path of the current mirror S. A gate of the third transistor T3 is additionally connected through a first resistor R1 to the third supply potential V3 of the supply voltage. A second connection of the output path of the current mirror S is connected through a second resistor R2 to the fourth supply potential V4 of the supply voltage and is connected to a gate of a fourth transistor T4, which is of the p-channel type. A first connection of the main current path of the fourth transistor T4 is connected to the fourth supply potential V4 of the supply voltage and a second connection of the main current path of the fourth transistor T4 is connected through a third resistor R3 to the second supply potential V2 of the supply voltage. The second connection of the main current path of the fourth transistor T4 carries an output signal G of the regulating circuit RS.

The switching circuit St is connected as follows: A gate of the second transistor T12 of the switching circuit St, which is of the n-channel type, is connected to the output signal G of the regulating circuit RS. A gate of the first transistor T11 of the switching circuit St, which is of the p-channel type, is connected to the signal READ0, which is a complementary signal to the input signal $\overline{READ0}$.

Figure 2:
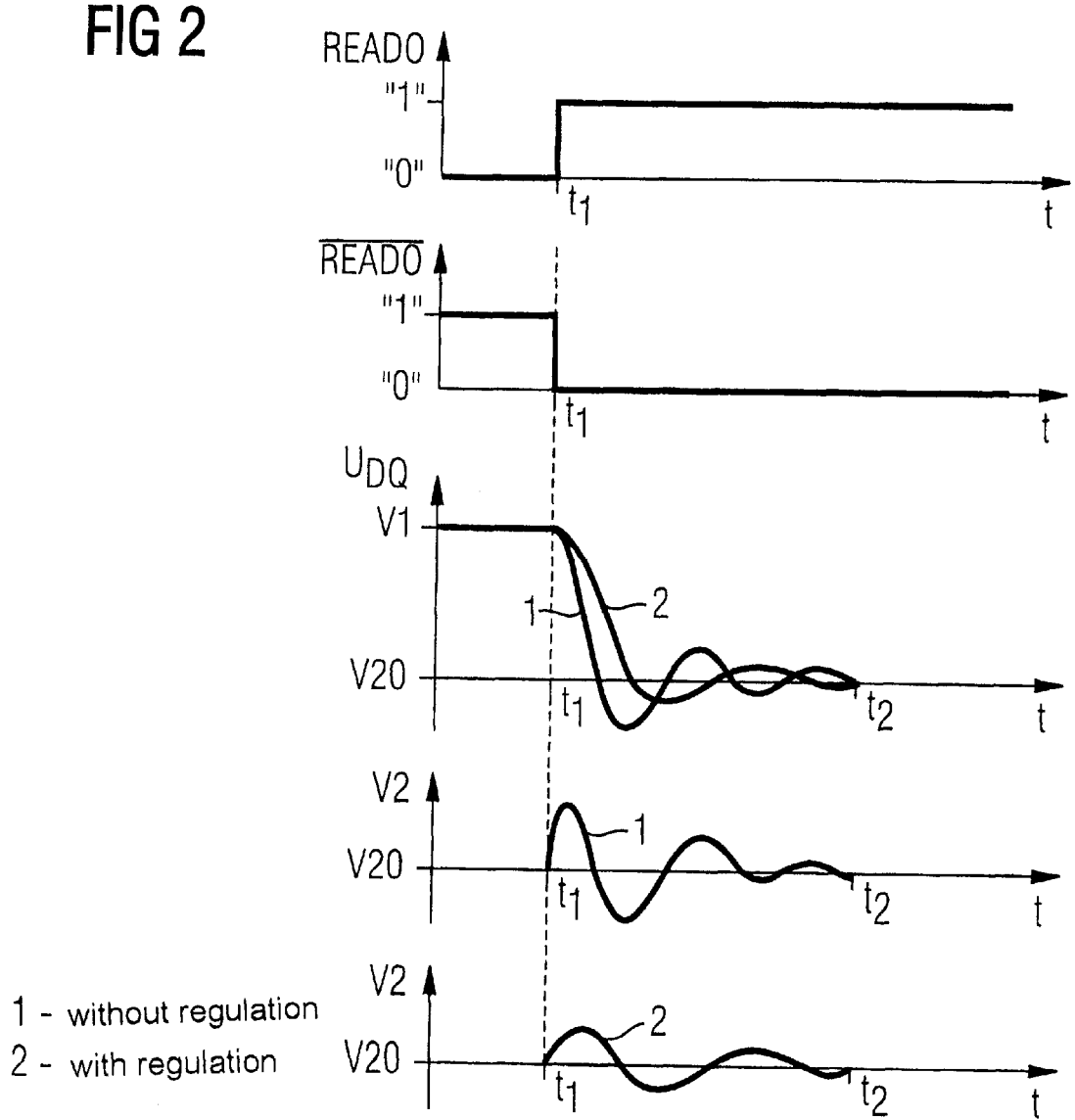
FIG. 2 is a graph showing an example of a voltage progression of an output signal DQ ($U_{DQ}$) and a progression of a supply voltage V2 during a switching process of the switching circuit with and without regulation.

FIG. 2 also shows a principle voltage progression for the signal sequence of the output signal DQ=log.1 to DQ=log.0, for the circuit according to FIG. 3. In this case too, the starting point is READ0=log.0 and DQ=log.1. In addition, at the beginning of the switching process, for example, according to the figures following FIG. 3:

$V1 > 0V, V2 = 0V, V3 = 0V, V4 = 2.5V,$ $K1 = V3 = 0V, K2 = K4 = 2.5V, G = V2 = 0V.$

The signal READ0=log.1 is applied, which corresponds to an application of the input signal $\overline{READ0}$=log.0 at the input (t1). The interaction of the regulating circuit RS and the switching circuit St during the switching process from DQ=1 to DQ=0 will now be described: $\overline{READ0}$ goes to 0V (corresponding in this case to log.0) and the transistor T1 becomes conducting. A node K1 receives the potential of the forward voltage of the transistor T2. This potential corresponds approximately to the threshold voltage of the transistor T3. The transistor T3 opens and the potential at a node K2 drops. The transistor T4 opens and the potential at G increases. The transistor T12 of the switching circuit St opens (as for operation without regulation), the voltage at the output line DQ drops and the potential V2 increases as a result of the inductive voltage drop at the led-out line of the supply voltage. This potential increase causes closure of the transistor T3 which, as described above, is operated at the threshold voltage. As a result, the potential at the node K2 increases. The transistor T4 closes and the potential at G drops. The transistor T12 of the switching circuit St closes and the potential at the supply voltage V2 drops as a result. The transistor T3 is opened again. Consequently, as just described, the transistor T12 is also opened again and the potential at the supply voltage V2 increases. The sequence described is repeated until the voltage at the output line DQ has dropped to the potential V2, which is back in the initial state (FIG. 2, Curve 2, time $t_2$). In this way a voltage fluctuation at the supply voltage arising through the switching process of the switching circuit St is counteracted.

The regulating circuit RS which was explained on the basis of FIG. 3 is effective only for voltage-dependent regulation of the switching characteristics of the switching circuit St for the transition $\overline{READ0}$=log.1 to $\overline{READ0}$=log.0. In the case of the transition $\overline{READ0}$=log.0 to $\overline{READ0}$=log.1 a second regulating circuit with an analogous manner of working is necessary, as described in the following.

Figure 4:
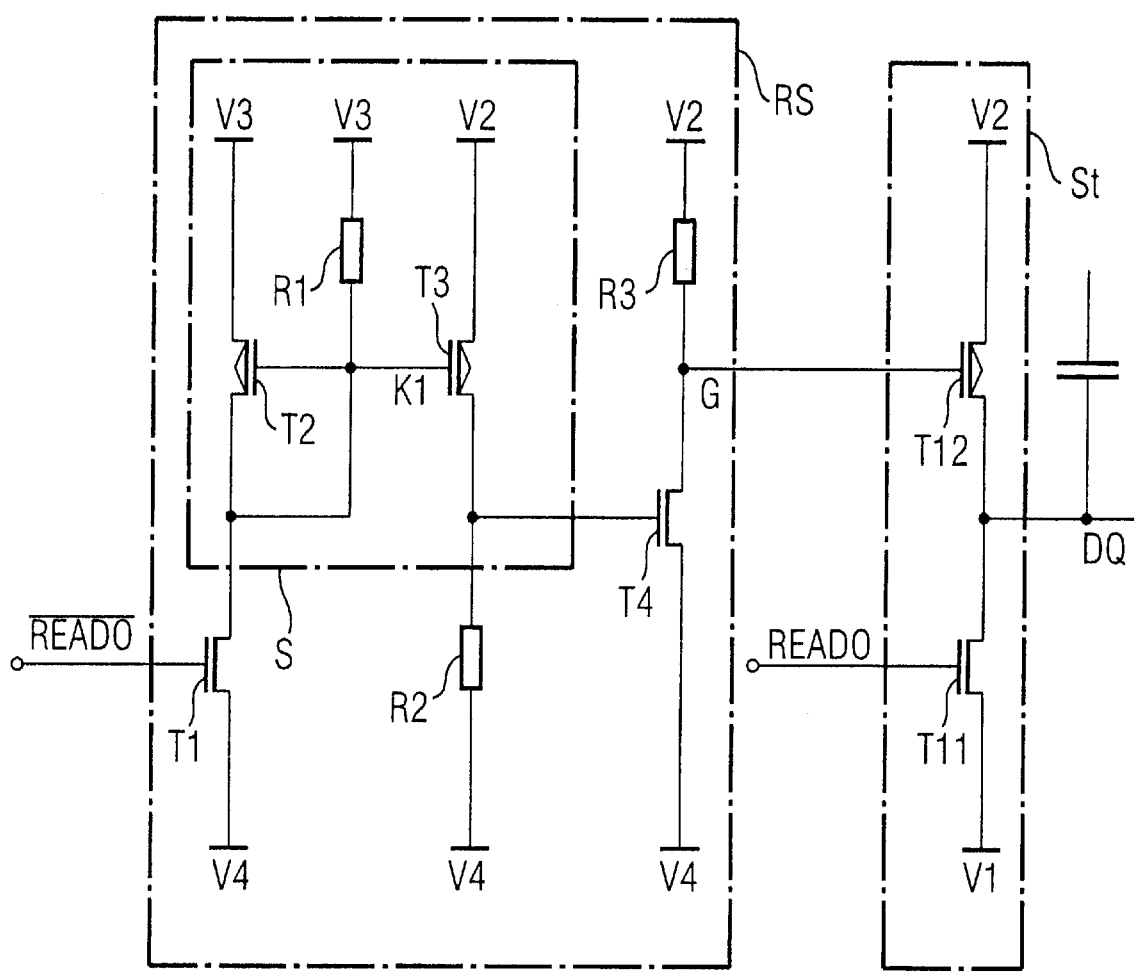
FIG. 4 is a schematic circuit diagram of an output driver with voltage-dependent regulated switching characteristics for a switching process DQ=log.0 to DQ=log.1.

FIG. 4 illustrates an output driver with voltage-dependent regulated switching characteristics for the above transition $\overline{READ0}$=log.0 to $\overline{READ0}$=log.1. The supply voltage of the output driver also has four supply potentials in this case.

The second supply potential V2 and the third supply potential V3 of the supply voltage are higher than the first supply potential V1 and the fourth supply potential V4 of the supply voltage. The first supply potential V1 and the fourth supply potential V4 of the supply voltage are decoupled on the semiconductor chip and are equal in the stationary state (outside a switching process). As an example, actual values are also stated herein:

$V1=0V, V2>0V, V3>0V$ and $V4=0V.$

In comparison with the transistors used in FIG. 3, the transistors used in FIG. 4 are of a different channel type: i.e., the first transistor T1 is of the n-channel type, the second transistor T2 is of the p-channel type, the third transistor T3 is of the p-channel type, the fourth transistor T4 is of the n-channel type, the first transistor T11 of the switching circuit St is of the n-channel type and the second transistor T12 of the switching circuit St is of the p-channel type.

In both variants of the output driver, the respective other inputs remain connected to the signal READ0, which is complementary to the input signal $\overline{READ0}$.

It is also possible to define a switching circuit for both switching processes ($\overline{READ0}$=log.1 to $\overline{READ0}$=log.0, $\overline{READ0}$=log.0 to $\overline{READ0}$=log.1). In this case the regulating circuit according to FIG. 3 is used for controlling the transistor of the switching circuit St connected to the lower potential of the supply voltage. This regulates the transition $\overline{READ0}$=log.1 to $\overline{READ0}$=log.0. Instead of connecting the gate of the other transistor of the switching circuit St directly to the signal READ0, a second regulating circuit is used for controlling the transistor connected to the higher potential of the supply voltage. This regulates the transition $\overline{READ0}$=log.0 to $\overline{READ0}$=log.1. This is illustrated in FIG. 4 and derives directly from the statement presented above for the switching process $\overline{READ0}$=log.0 to $\overline{READ0}$=log.1.

The setting of the switching speed and the damping of the voltage fluctuations also depend on the parameters of the components used in the output driver. Depending on the type of transistors or resistors used, different sequences of switching processes and voltage progressions are generated.

In choosing a transistor type for the realization of this regulating circuit RS and the switching circuit St, it is of advantage to use field effect transistors since their favorable characteristics such as high switching speed and low dissipation power are advantageous for the operation of the regulating circuit RS. However, it is also possible to achieve the illustrated basic mode of operation through a circuit structure using bipolar transistors. In this case field effect transistors of the n-channel type must be replaced with bipolar transistors of the n-p-n type, and field effect transistors of the p-channel type must be replaced with bipolar transistors of the p-n-p type.

I claim:

1. In an integrated semiconductor chip, an output driver generating an output signal output over an output signal line from an input signal supplied over an input signal line, the output driver comprising:

a switching circuit including two transistors having gate terminals, having main current paths connected in series and connected to a supply voltage with a first supply potential and a second supply potential; and a regulating circuit for voltage-dependent regulation of switching characteristics of said switching circuit, said regulating circuit including:

a first transistor having a gate terminal connected to the input signal;

second and third transistors together forming a current mirror, said second transistor having a main current path forming an input path of said current mirror, said third transistor having a gate terminal and having a main current path forming an output path of said current mirror, and said input and output paths of said current mirror each having first and second connections;

said first connection of said input path of said current mirror connected to a third supply potential of the supply voltage and said first connection of said output path of said current mirror connected to the second supply potential of the supply voltage;

said first transistor having a main current path with a first connection connected to a fourth supply potential of the supply voltage and with a second connection connected to said input path of the current mirror;

a first resistor connected between said gate terminal of said third transistor and the third supply potential of the supply voltage;

a second resistor connected between said second connection of said output path of said current mirror and the fourth supply potential of the supply voltage;

a fourth transistor having a gate terminal connected to said second connection of said output path of said current mirror and having a main current path with first and second connections;

said first connection of said main current path of said fourth transistor connected to the fourth supply potential of the supply voltage;

a third resistor connected between said second connection of said main current path of said fourth transistor and the second supply potential of the supply voltage; and a connection carrying an output signal of said regulating circuit and connected between said second connection of said main current path of said fourth transistor and said gate terminal of one of said transistors of said switching circuit.

2. The output driver according to claim 1, wherein:

said two transistors of said switching circuit are first and second transistors having different conduction types and having a coupling node therebetween;

the output signal line for the output signal is connected to said coupling node; and said first transistor of said switching circuit is connected to the first supply potential of the supply voltage and said second transistor of said switching circuit is connected to the second supply potential of the supply voltage.

3. The output driver according to claim 2, wherein:

said transistors are field effect transistors;

said first transistor of said regulating circuit is of the p-channel type, said second transistor of said regulating circuit is of the n-channel type, said third transistor of said regulating circuit is of the n-channel type, and said fourth transistor of said regulating circuit is of the p-channel type;

said first transistor of said switching circuit is of the p-channel type and said second transistor of said switching circuit is of the n-channel type;

the first supply potential and the fourth supply potential of the supply voltage are higher than the second supply potential and the third supply potential of the supply voltage; and the third supply potential and the second supply potential of the supply voltage are decoupled on the semiconductor chip.

4. The output driver according to claim 2, wherein:

said transistors are field effect transistors;

said first transistor of said regulating circuit is of the n-channel type, said second transistor of said regulating circuit is of the p-channel type, said third transistor of said regulating circuit is of the p-channel type, and said fourth transistor of said regulating circuit is of the n-channel type;

said first transistor of said switching circuit is of the n-channel type and said second transistor of said switching circuit is of the p-channel type;

the second supply potential and the third supply potential of the supply voltage are higher than the first supply potential and the fourth supply potential of the supply voltage; and the first supply potential and the fourth supply potential of the supply voltage are decoupled on the semiconductor chip.

* * * * *